(12) United States Patent
Okada et al.

(10) Patent No.: US 10,976,626 B2
(45) Date of Patent: Apr. 13, 2021

(54) DISPLAY DEVICE

(71) Applicant: Sharp Kabushiki Kaisha, Sakai (JP)

(72) Inventors: Kuniaki Okada, Sakai (JP); Keisuke Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/895,114

(22) Filed: Jun. 8, 2020

(65) Prior Publication Data

US 2020/0393730 A1 Dec. 17, 2020

Related U.S. Application Data

(60) Provisional application No. 62/861,340, filed on Jun. 14, 2019.

(51) Int. Cl.
*G02F 1/136* (2006.01)
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *G02F 1/136227* (2013.01); *H01L 27/124* (2013.01); *H01L 27/1225* (2013.01); *G02F 2001/13629* (2013.01); *G02F 2001/136222* (2013.01); *G02F 2201/123* (2013.01)

(58) Field of Classification Search
None
See application file for complete search history.

(56) References Cited

U.S. PATENT DOCUMENTS

| 6,031,512 A | 2/2000 | Kadota et al. |
| 2007/0146603 A1* | 6/2007 | Uehara ............ G02F 1/134363 349/141 |
| 2012/0138922 A1 | 6/2012 | Yamazaki et al. |
| 2013/0320334 A1 | 12/2013 | Yamazaki et al. |

(Continued)

FOREIGN PATENT DOCUMENTS

| JP | 11-24061 A | 1/1999 |
| JP | 2002-350886 A | 12/2002 |

(Continued)

*Primary Examiner* — James A Dudek
(74) *Attorney, Agent, or Firm* — Keating & Bennett, LLP (57) ABSTRACT

A display device includes: an active matrix substrate including a plurality of pixels arrayed in a matrix shape, wherein the active matrix substrate includes, in each of the plurality of pixels, a TFT, an insulating layer substantially covering the TFT, a pixel electrode formed of a transparent conductive material and electrically connected to the TFT, a color filter located between the TFT and the pixel electrode, and an intermediate layer electrode formed of a transparent conductive material, at least partially located between the insulating layer and the color filter, and electrically connecting a drain electrode of the TFT to the pixel electrode, the pixel electrode is connected to the intermediate layer electrode at a contact hole formed in the color filter, and when viewed in a normal direction of a display surface, the contact hole at least partially overlaps a gate electrode of the TFT.

10 Claims, 9 Drawing Sheets

(56) References Cited

U.S. PATENT DOCUMENTS

2014/0104527 A1* 4/2014 Yang ................. G02F 1/133514
                                                                          349/43
2014/0286076 A1    9/2014  Aoki et al.
2016/0358943 A1* 12/2016 Okada ............... H01L 29/42356

FOREIGN PATENT DOCUMENTS

| JP | 2012-134475 A | 7/2012 |
| --- | --- | --- |
| JP | 2014-007399 A | 1/2014 |
| JP | 2014-209727 A | 11/2014 |

\* cited by examiner

DISPLAY DEVICE

CROSS-REFERENCE TO RELATED APPLICATION

The present application claims priority from Provisional Application No. 62/861,340, the content to which is hereby incorporated by reference into this application.

BACKGROUND OF THE INVENTION

1. Field of the Invention

The present invention relates to a display device, more particularly to a display device provided with an active matrix substrate including a color filter.

2. Description of the Related Art

In a typical liquid crystal display device, a color filter is provided on a counter substrate facing an active matrix substrate. Thus, the counter substrate may be referred to as a color filter substrate.

In recent years, an increase in the definition of liquid crystal display devices has progressed. In particular, liquid crystal display devices for head-mounted displays (HMD) are required to have a very high resolution because the display screen is viewed after being enlarged by a lens. Such ultra-high resolution liquid crystal display devices have a small pixel pitch. This causes a problem in that color deviation is likely to happen if bonding displacement occurs after the color filter is provided on the counter substrate side. Therefore, bonding displacement needs to be reduced as much as possible. However, this may lead to a decrease in yield.

A structure in which a color filter is provided on an active matrix substrate (referred to as a "color filter-on-array (COA) structure") has been proposed as a structure that can prevent color deviation caused by bonding displacement. A COA structure is disclosed in Japanese Unexamined Patent Application Publication No. H11-24061 and Japanese Unexamined Patent Application Publication No. 2002-350886, for example.

SUMMARY OF INVENTION

However, as a result of detailed research conducted by the inventors of the present application on the application of the COA structure to ultra-high resolution liquid crystal display devices, it has been ascertained that a new problem that an aperture ratio decreases due to the application of the COA structure may arise. This problem is attributable to the need to form contact holes in color filters for electrically connecting a thin film transistor (TFT) to a pixel electrode in each pixel, as will be described in detail below.

Even in a bottom-emitting organic EL display device, there is a demand for further improving aperture ratio.

In light of the above problems, an aspect of the present invention is to improve an aperture ratio of a display device provided with an active matrix substrate including a color filter.

An aspect of the present invention discloses a display device according to the following items.

Item 1

A display device including an active matrix substrate including a plurality of pixels arrayed in a matrix shape having a plurality of rows and a plurality of columns, and a plurality of scanning wiring lines extending in a row direction and a plurality of signal wiring lines extending in a column direction, in which the active matrix substrate includes, in each of the plurality of pixels, a TFT including a semiconductor layer, a gate insulating layer, a gate electrode, a source electrode, and a drain electrode, an insulating layer substantially covering the TFT, a pixel electrode formed of a transparent conductive material and electrically connected to the TFT, a color filter located between the TFT and the pixel electrode, and an intermediate layer electrode formed of a transparent conductive material, at least partially located between the insulating layer and the color filter, and electrically connecting the drain electrode of the TFT to the pixel electrode, in which the pixel electrode is connected to the intermediate layer electrode at a contact hole formed in the color filter, and in which, when viewed in a normal direction of a display surface, the contact hole at least partially overlaps the gate electrode of the TFT.

Item 2

The display device according to Item 1, in which, in a case where a region surrounded by two adjacent scanning wiring lines of the plurality of scanning wiring lines and two adjacent signal wiring lines of the plurality of signal wiring lines is referred to as a pixel opening region, the pixel opening region includes a first region in which the insulating layer is formed and a second region in which the insulating layer is not formed.

Item 3

The display device according to Item 2, in which the insulating layer is not formed except on or near the plurality of scanning wiring lines, the plurality of signal wiring lines, and the TFT.

Item 4

The display device according to Item 2 or 3, wherein, when viewed in a normal direction of a display surface, the second region occupies not less than 30% of the pixel opening region.

Item 5

The display device according to any one of Items 2 to 4, in which the drain electrode of the TFT is formed of a metal material, and, in the second region of the pixel opening region, the drain electrode of the TFT is connected to the intermediate layer electrode.

Item 6

The display device according to any one of Items 2 to 4, in which the drain electrode of the TFT is a transparent drain electrode integrally formed with the intermediate layer electrode, and, in the second region of the pixel opening region, the transparent drain electrode is connected to the semiconductor layer.

Item 7

The display device according to any one of Items 1 to 6, in which the active matrix substrate further includes, in each of the plurality of pixels, a light blocking layer provided below the gate electrode.

Item 8

The display device according to Item 7, in which, when viewed in a normal direction of a display surface, the light blocking layer includes a portion overlapping the gate electrode and a portion not overlapping the gate electrode.

Item 9

The display device according to any one of Items 1 to 8, wherein the semiconductor layer of the TFT is an oxide semiconductor layer.

Item 10

The display device according to Item 9, wherein the oxide semiconductor layer includes an In—Ga—Zn—O based semiconductor.

Item 11

The display device according to Item 10, wherein the In—Ga—Zn—O based semiconductor includes a crystalline portion.

Item 12

The display device according to any one of Items 1 to 11, in which the display device is a liquid crystal display device further including a counter substrate facing the active matrix substrate, and a liquid crystal layer provided between the active matrix substrate and the counter substrate.

According to an aspect of the present invention, an aperture ratio of a display device provided with an active matrix substrate including a color filter can be improved.

DETAILED DESCRIPTION OF THE INVENTION

Hereinafter, embodiments of the present invention will be described with reference to the accompanying drawings. Note that the following describes an example of a liquid crystal display device in a fringe-field switching (FFS) mode, but embodiments of the present invention are not limited thereto.

First Embodiment

Figure 1:
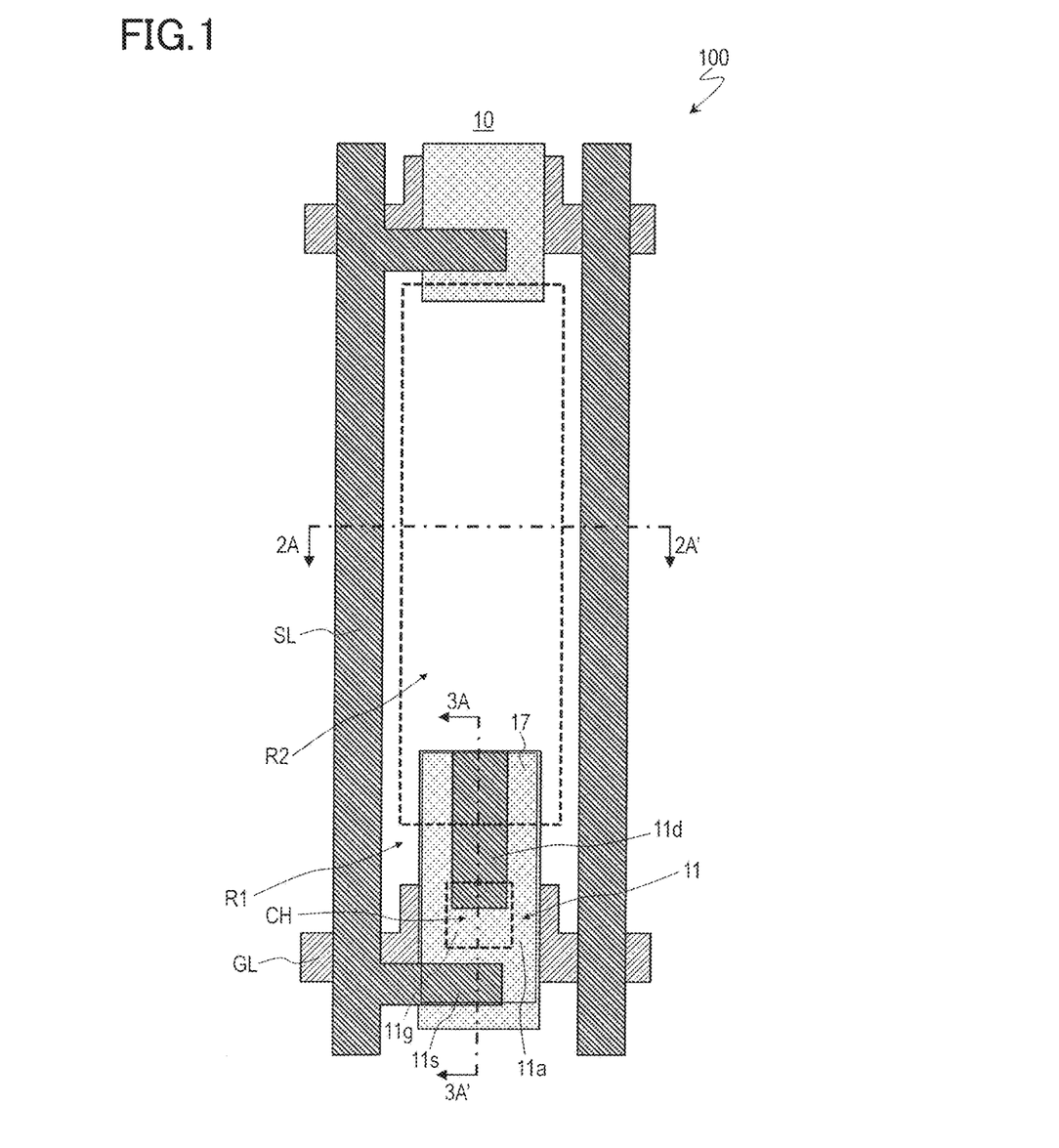
FIG. 1 is a plan view schematically illustrating a liquid crystal display device 100 according to an embodiment of the present invention and illustrates a region corresponding to one pixel.
Figure 2:
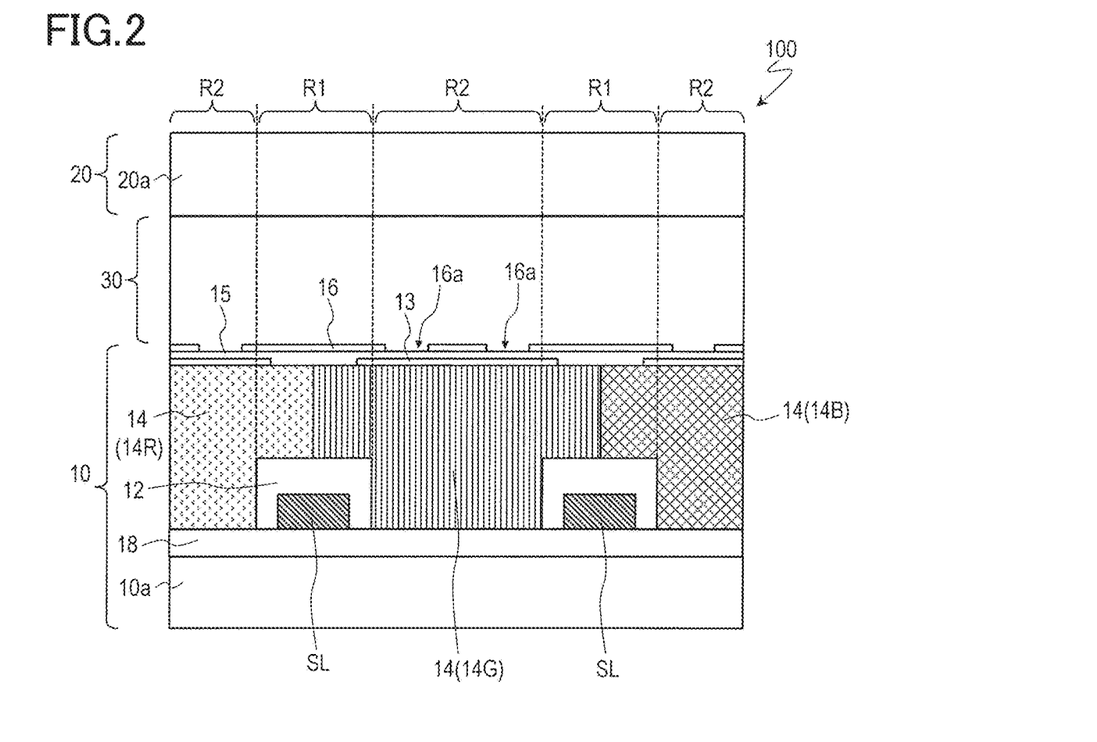
FIG. 2 is a cross-sectional view schematically illustrating the liquid crystal display device 100 and illustrates a cross-sectional structure along the line 2A-2A' in FIG. 1.
Figure 3:
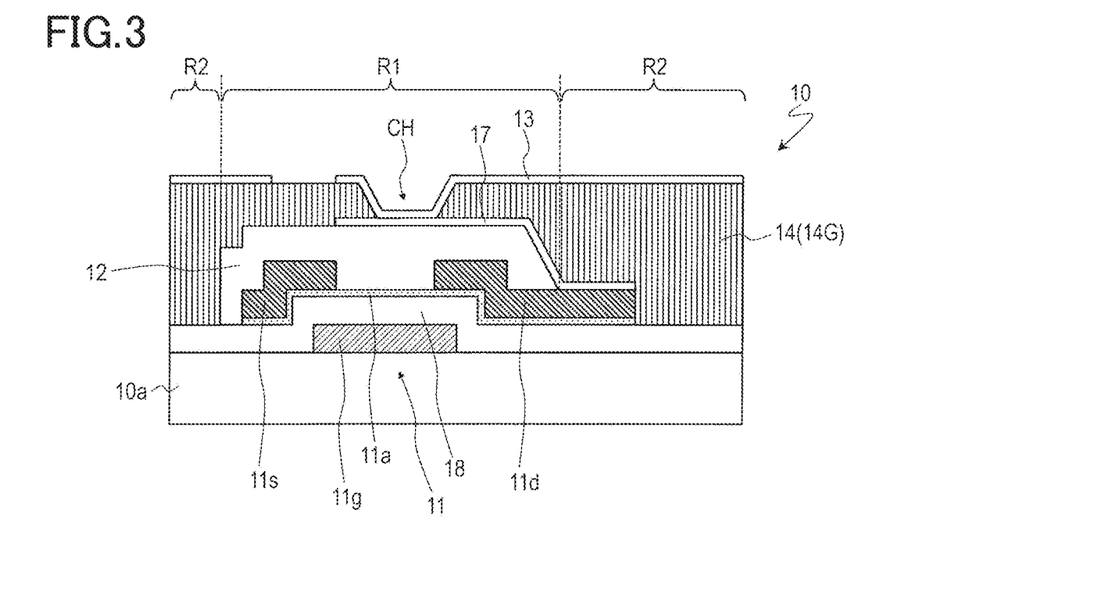
FIG. 3 is a cross-sectional view of an active matrix substrate 10 of the liquid crystal display device 100 and illustrates a cross-sectional structure along the line 3A-3A' in FIG. 1.

A liquid crystal display device 100 according to the present embodiment will be described with reference to FIGS. 1 to 3. FIGS. 1 and 2 are a plan view and a cross-sectional view schematically illustrating the liquid crystal display device 100, respectively. FIG. 1 illustrates a region corresponding to one pixel in the liquid crystal display device 100, and FIG. 2 illustrates a cross-sectional structure along the line 2A-2A' in FIG. 1. FIG. 3 is a cross-sectional view of an active matrix substrate 10 of the liquid crystal display device 100 and illustrates a cross-sectional structure along the line 3A-3A' in FIG. 1.

As illustrated in FIGS. 1 to 3, the liquid crystal display device 100 includes the active matrix substrate (hereinafter, referred to as a "TFT substrate") 10, a counter substrate 20 facing the TFT substrate 10, and a liquid crystal layer 30 provided between the TFT substrate 10 and the counter substrate 20. In addition, the liquid crystal display device 100 includes a plurality of pixels. The plurality of pixels are arrayed in a matrix shape including a plurality of rows and a plurality of columns.

The TFT substrate 10 includes a plurality of scanning wiring lines (gate bus lines) GL extending in the row direction and a plurality of signal wiring lines (source bus lines) SL extending in the column direction. Herein, a region surrounded by two adjacent scanning wiring lines GL of the plurality of scanning wiring lines GL and two adjacent signal wiring lines SL of the plurality of signal wiring lines SL is referred to as a "pixel opening region". The TFT substrate 10 also includes, in each of the plurality of pixels, a thin film transistor (TFT) 11, an insulating layer 12, a pixel electrode 13, a color filter 14, a dielectric layer 15, a common electrode 16, and an intermediate layer electrode 17. Note that the dielectric layer 15 and the common electrode 16 are omitted in FIG. 3. The constituent elements of the TFT substrate 10 (the TFT 11 and the like) are supported by a transparent substrate 10a (e.g., a glass substrate) having insulating properties.

The TFT 11 includes a semiconductor layer 11a, a gate insulating layer 18, a gate electrode 11g, a source electrode s, and a drain electrode 11d. Here, a TFT 11 having a bottom gate structure is illustrated.

The gate electrode 11g and the scanning wiring lines GL of the TFT 11 are provided on the substrate 10a. The gate electrode 11g and the scanning wiring lines GL are formed of a metal material. The gate electrode 11g is electrically connected to corresponding scanning wiring lines GL and supplied with a scanning signal (a gate signal) from the scanning wiring lines GL. In the illustrated example, the scanning wiring lines GL and the gate electrode 11g are integrally formed.

The gate insulating layer (first insulating layer) 18 is formed to cover the gate electrode 11g and the scanning wiring lines GL.

The semiconductor layer 11a is provided on the gate insulating layer 18. A channel region of the semiconductor layer 11a faces the gate electrode 11g with the gate insulating layer 18 interposed therebetween. In the present embodiment, the semiconductor layer 11a is an oxide semiconductor layer.

The source electrode 11s and the drain electrode 11d are electrically connected to the semiconductor layer 11a. The source electrode 11s and the drain electrode 11d are each formed such that both the source electrode 11s and the drain electrode 11d are at least partially located on the semiconductor layer 11a. Further, the lower face of each of the source electrode 11s and the drain electrode 11d is in contact with an upper face of the semiconductor layer 11a to be electrically connected to the semiconductor layer 11a. The source electrode 11s is electrically connected to corresponding signal wiring lines SL and supplied with a display signal (a source signal) from the signal wiring lines SL. In the illustrated example, the source electrode 11s extends from the signal wiring lines SL. In other words, the signal wiring lines SL and the source electrode 11s are integrally formed. The drain electrode 11d is electrically connected to the pixel electrode 13. The source electrode 11s, the drain electrode 11d, and the signal wiring lines SL are formed of a metal material.

The insulating layer (second insulating layer) 12 substantially covers the TFT 11. However, a portion of the drain electrode 11d is not covered by the insulating layer 12. The pixel opening region includes a region (referred to as a "first region") R1 in which the insulating layer 12 is formed and a region (referred to as a "second region") R2 in which the insulating layer 12 is not formed. In the present embodiment, the insulating layer 12 is not formed except on or near the scanning wiring lines GL, the signal wiring lines SL, and the TFT 11. When viewed in the normal direction of a display surface, the second region R2 typically occupies not less than 30% of the pixel opening region.

The pixel electrode 13 is formed of a transparent conductive material (e.g., IZO). The pixel electrode 13 is electrically connected to the TFT 11, more specifically, to the drain electrode 11d of the TFT 11.

The color filter 14 is located between the TFT 11 and the pixel electrode 12. As illustrated, the color filter 14 of each pixel is typically any of a red color filter 14R, a green color filter 14G, and a blue color filter 14B, for example. The color filter 14 is formed of a colored photosensitive resin material, for example. The color filter 14 of each pixel is unilamellar (i.e., has no layered structure).

The intermediate layer electrode 17 is formed of a transparent conductive material (e.g., IZO). The intermediate layer electrode 17 is at least partially located between the insulating layer 12 and the color filter 14. The intermediate layer electrode 17 electrically connects the drain electrode 11d of the TFT 11 and the pixel electrode 13. The intermediate layer electrode 17 is connected to the drain electrode 11d of the TFT 11 in the second region R2 of the pixel opening region (region where the insulating layer 12 is not formed). The pixel electrode 13 is connected to the intermediate layer electrode 17 at a contact hole CH formed in the color filter 14. When viewed in the normal direction of a display surface, the contact hole CH at least partially overlaps the gate electrode 11g of the TFT 11. In the illustrated configuration, substantially the entire contact hole CH overlaps the gate electrode 11g.

The dielectric layer 15 is provided covering the pixel electrode 13. The common electrode 16 is provided on the dielectric layer 15. The common electrode 16 is formed of a transparent conductive material (e.g., IZO). At least one slit 16a is formed in the common electrode 16 per pixel.

The counter substrate 20 includes a transparent substrate 20a (e.g., a glass substrate) having insulating properties. Although not illustrated, a transparent resin layer and/or a transparent conductive layer may be provided on the substrate 20a. The counter substrate 20 may not include a light blocking layer (a black matrix).

Although not illustrated, alignment films are provided on the outermost surface of the TFT substrate 10 on a side closer to the liquid crystal layer 30 and the outermost surface of the counter substrate 20 on a side closer to the liquid crystal layer 30. In the present embodiment, the alignment film of the TFT substrate 10 and the alignment film of the counter substrate 20 are each horizontal alignment film.

Figure 8:
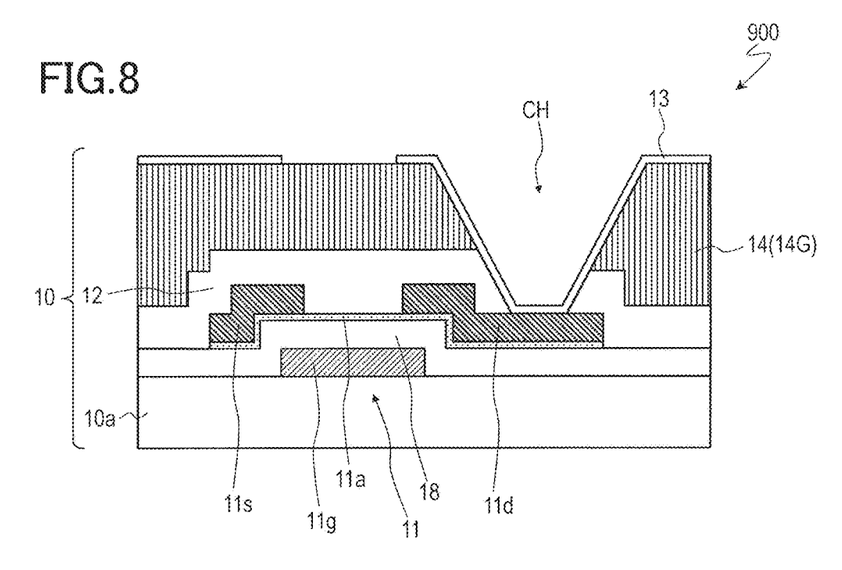
FIG. 8 is a cross-sectional view schematically illustrating a liquid crystal display device 900 according to a comparative example.

In the liquid crystal display device 100 having the configuration described above, an aperture ratio can be increased further than in a conventional liquid crystal display device having a COA structure. The reasons for this will be described below. First, the reason why the aperture ratio decreases when the COA structure is applied will be described with reference to FIG. 8. FIG. 8 is a cross-sectional view illustrating the vicinity of the TFT 11 of a liquid crystal display device 900 according to a comparative example, and corresponds to FIG. 3 illustrating the liquid crystal display device 100. In FIG. 8, the liquid crystal layer and the counter substrate are omitted. Further, the common electrode and the dielectric layer of the TFT substrate 10 are omitted.

The liquid crystal display device 900 according to the comparative example differs from the liquid crystal display device 100 illustrated in FIG. 1 and other figures in that the TFT substrate 10 does not include an intermediate layer electrode. In the liquid crystal display device 900, the contact hole CH is formed in the insulating layer 12 and the color filter 14 such that a portion of the drain electrode 11d of the TFT 11 is exposed. Further, the pixel electrode 13 is connected to the drain electrode 11d at the contact hole CH. When viewed in the normal direction of a display surface, the contact hole CH does not overlap the gate electrode 11g.

Components such as the dielectric layer and the common electrode located on the pixel electrode 13 are not illustrated in FIG. 8. A front face of the TFT substrate 10 on a side closer to the liquid crystal layer includes a recess conforming to the shape of the contact hole CH, and alignment of the liquid crystal molecules may be disturbed by a large step formed due to the presence of the recess. Light leakage due to disturbance in alignment causes a reduction in contrast ratio. When a light blocking layer is disposed below the contact hole CH to prevent a reduction in the contrast ratio, the aperture ratio decreases.

Because the liquid crystal display device 900 has a COA structure and the color filter 14 is located below the pixel electrode 13, the depth of the contact hole CH increases by the thickness of the color filter 14 (generally, a thickness of approximately 2 μm is required), and thus the size of the contact hole CH increases. As a result, the degree of light leakage increases, and the contrast ratio further decreases. When a light blocking layer is provided, the aperture ratio further reduces because there is a need to increase the area of the light blocking layer.

As described above, in the liquid crystal display device 900 according to the comparative example, providing a light blocking layer to prevent a reduction in the contrast ratio due to the contact hole CH causes the aperture ratio to decrease. A low aperture ratio is disadvantageous to high definition.

In contrast, in the liquid crystal display device 100 according to an embodiment of the present invention, the drain electrode 11d of the TFT 11 and the pixel electrode 13 are electrically connected with the intermediate layer electrode 17 interposed therebetween, and the contact hole CH connected to the pixel electrode 13 and the intermediate layer electrode 17 at least partially overlaps the gate electrode 11g of the TFT 11. Thus, since the gate electrode 11g may function as a light blocking layer, there is no need to provide a separate light blocking layer to prevent a reduction in the contrast ratio due to light leakage, or the area of a separately-provided light blocking layer can be reduced. As a result, the aperture ratio can be improved.

Further, because the contact hole CH need only be formed in the color filter 14 (i.e., there is no need to form the contact hole CH in the insulating layer 12), the depth of the contact hole CH can be reduced by the thickness of the insulating layer 12, as compared to the liquid crystal display device 900 according to the comparative example illustrated in FIG. 8. As a result, the contact hole CH can be made smaller and the degree of light leakage can be reduced. Thus, the contrast ratio can be increased.

From the perspective of reducing the size of the contact hole CH, as in the present embodiment, the insulating layer 12 is preferably not formed except on or near the scanning wiring lines GL, the signal wiring lines SL, and the TFT 11 (i.e., the insulating layer 12 is not formed at most portions within the pixel opening region). By adopting such a configuration, the height of the upper face of the color filter 14 can be reduced. Thus, the depth of the contact hole CH can be further reduced to make the contact hole CH even smaller. For example, in the liquid crystal display device 900 according to the comparative example, when the thickness of the color filter 14 is approximately 2 μm and the thickness of the insulating layer 12 is approximately A μm, the depth of the contact hole CH is approximately (2+A) μm. In contrast, in the liquid crystal display device 100 according to the present embodiment, when the thickness of the color filter 14 is approximately 2 μm and the sum of the thickness of the gate electrode 11g and the thickness of the insulating layer 12 is approximately 1 μm, the depth of the contact hole CH is approximately 1 μm.

An example of a manufacturing method of the liquid crystal display device 100 of the present embodiment will be described with reference to FIGS. 4A to 4F. FIGS. 4A to 4F are cross-sectional views illustrating a preparation process of the TFT substrate 10 of the liquid crystal display device 100, and illustrate the same region (region near the TFT 11) as the region illustrated in FIG. 3.

First, the preparation process of the TFT substrate 10 will be described.

Figure 4A:
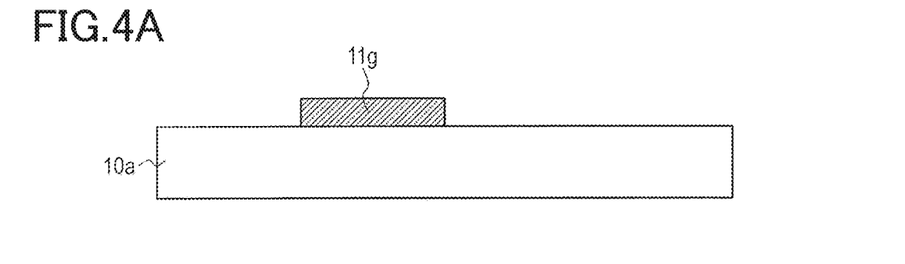
FIG. 4A is a cross-sectional view illustrating a preparation process of the active matrix substrate 10 and illustrates the same region (region near a TFT 11) as the region illustrated in FIG. 3.

First, as illustrated in FIG. 4A, a conductive film (gate metal film) is deposited on the substrate (e.g., glass substrate) 10a. Then, the conductive film is patterned using a photolithography process to form the scanning wiring lines GL and the gate electrode 11g. The gate metal film is, for example, a layered film (W/TaN film) including a W layer as an upper layer and a TaN layer as a lower layer. However, the gate metal film is not limited thereto.

Figure 4B:
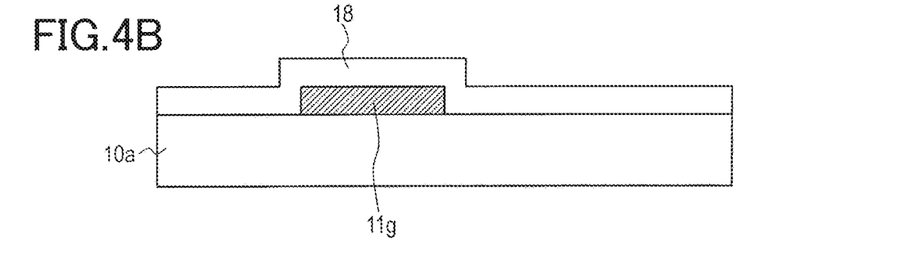
FIG. 4B is a cross-sectional view illustrating a preparation process of the active matrix substrate 10 and illustrates the same region (region near the TFT 11) as the region illustrated in FIG. 3.

Next, as illustrated in FIG. 4B, the gate insulating layer 18 is formed to cover the scanning wiring lines GL and the gate electrode 11g. The gate insulating layer 18 is, for example, a layered film including a silicon oxide ($SiO_2$) layer as an upper layer and a silicon nitride (SiNx) layer as a lower layer. However, the gate insulating layer 18 is not limited thereto.

Figure 4C:
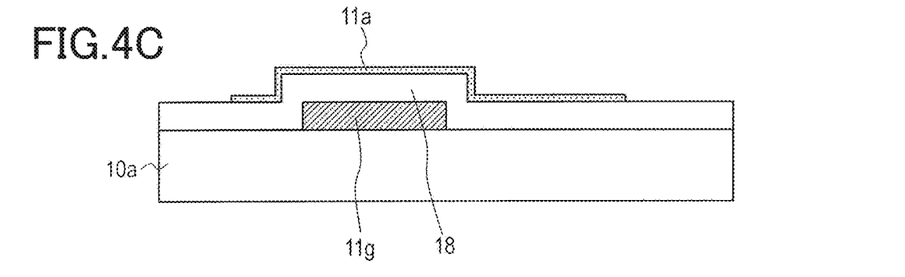
FIG. 4C is a cross-sectional view illustrating a preparation process of the active matrix substrate 10 and illustrates the same region (region near the TFT 11) as the region illustrated in FIG. 3.

Next, as illustrated in FIG. 4C, an oxide semiconductor film is deposited on the gate insulating layer 18. Then, the oxide semiconductor film is patterned using a photolithography process to form the oxide semiconductor layer 11a. The oxide semiconductor layer 11a is, for example, an In—Ga—Zn—O based semiconductor layer.

Figure 4D:
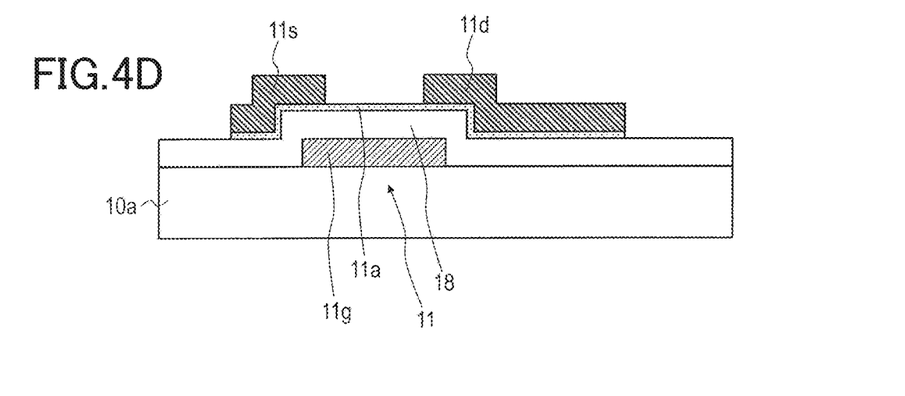
FIG. 4D is a cross-sectional view illustrating a preparation process of the active matrix substrate 10 and illustrates the same region (region near the TFT 11) as the region illustrated in FIG. 3.

Thereafter, as illustrated in FIG. 4D, a conductive film (source metal film) is deposited on the oxide semiconductor layer 11a and the gate insulating layer 18. Then, the conductive film is patterned using a photolithography process to form the signal wiring lines SL, the source electrode 11s, and the drain electrode 11d. The source metal film is, for example, a layered film (Ti/Al/Ti film) including a Ti layer as an upper layer, an Al layer as an intermediate layer and a Ti layer as a lower layer. However, the source metal film is not limited thereto.

Figure 4E:
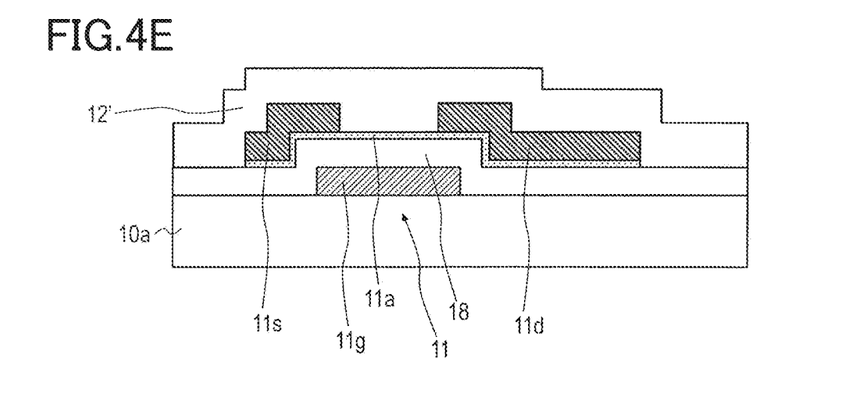
FIG. 4E is a cross-sectional view illustrating a preparation process of the active matrix substrate 10 and illustrates the same region (region near the TFT 11) as the region illustrated in FIG. 3.

Next, as illustrated in FIG. 4E, an insulating film 12' is deposited on the entire surface of the substrate 10a to cover the TFT 11. The insulating film 12' is, for example, a silicon oxide ($SiO_2$) film.

Figure 4F:
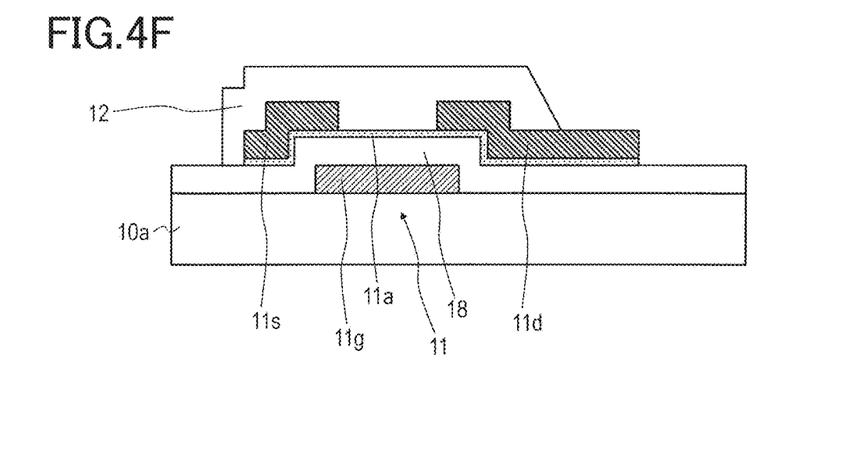
FIG. 4F is a cross-sectional view illustrating a preparation process of the active matrix substrate 10 and illustrates the same region (region near the TFT 11) as the region illustrated in FIG. 3.

Next, as illustrated in FIG. 4F, the insulating film 12' is patterned using a photolithography process to remove portions of the insulating film 12' other than the scanning wiring lines GL, the signal wiring lines SL and the TFT 11, and the vicinity of those portions, to thereby form the insulating layer 12.

Figure 4G:
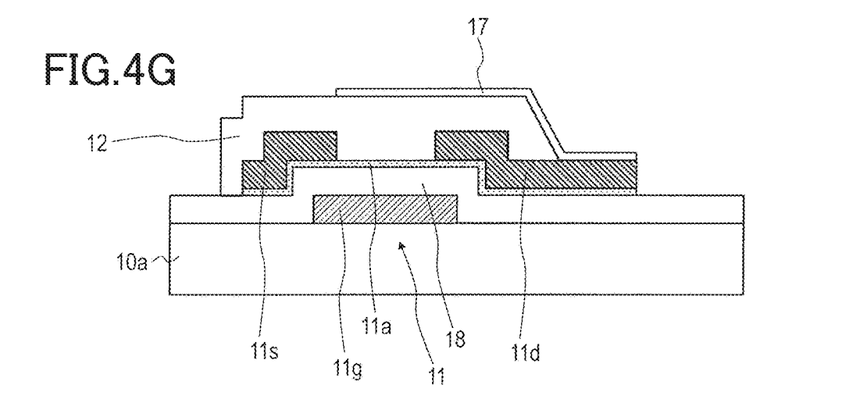
FIG. 4G is a cross-sectional view illustrating a preparation process of the active matrix substrate 10 and illustrates the same region (region near the TFT 11) as the region illustrated in FIG. 3.

Thereafter, as illustrated in FIG. 4G, a transparent conductive film (e.g., an IZO film) is deposited and then patterned using a photolithographic process to form the intermediate layer electrode 17.

Figure 4H:
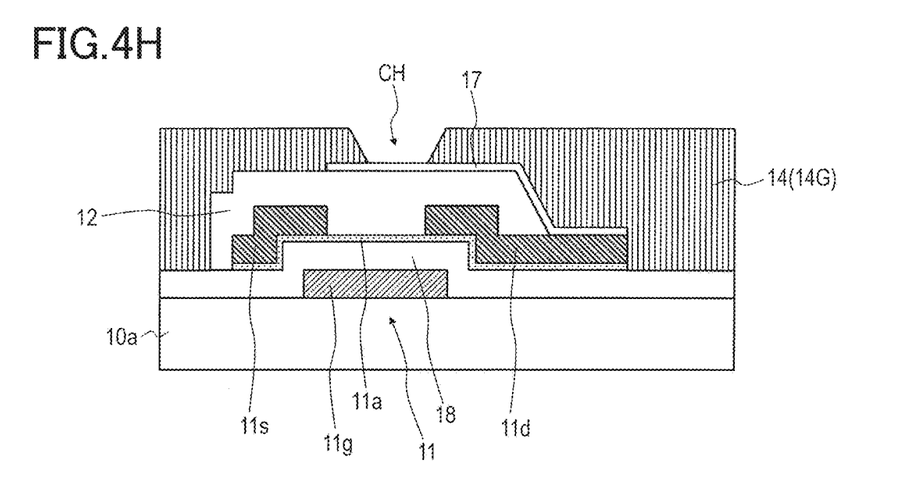
FIG. 4H is a cross-sectional view illustrating a preparation process of the active matrix substrate 10 and illustrates the same region (region near the TFT 11) as the region illustrated in FIG. 3.

Next, as illustrated in FIG. 4H, the red color filter 14R, the green color filter 14G, and the blue color filter 14B are sequentially formed by repeatedly imparting a colored photosensitive resin material and performing patterning using a photolithography process. Thereafter, patterning is performed using a photolithography process to form the contact hole CH in each pixel such that a portion of the intermediate layer electrode 17 is exposed. Note that the color filters for each color and the contact hole CH may be formed simultaneously.

Figure 4I:
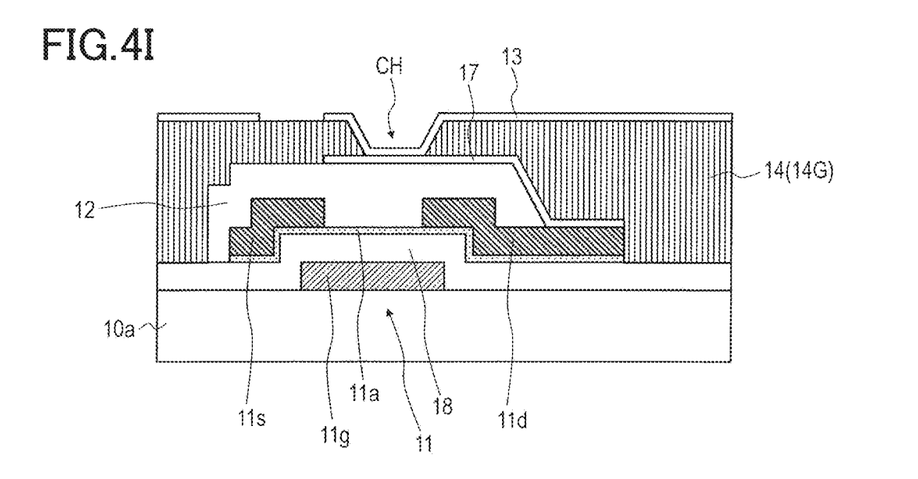
FIG. 4I is a cross-sectional view illustrating a preparation process of the active matrix substrate 10 and illustrates the same region (region near the TFT 11) as the region illustrated in FIG. 3.

Next, as illustrated in FIG. 4I, a transparent conductive film (e.g., an IZO film) is deposited and then patterned using a photolithographic process to form the pixel electrode 13.

Then, the dielectric layer 15 and the common electrode 16 are sequentially formed on the pixel electrode 13. Next, a columnar spacer formed from a photosensitive resin material is formed at a predetermined position. An alignment film is then formed. In this manner, the TFT substrate 10 is obtained.

The counter substrate 20 is prepared separately from the TFT substrate 10. Specifically, an alignment film is formed on the substrate (e.g., a glass substrate) 20a. If necessary, a transparent resin layer and/or a transparent conductive layer may also be formed on the substrate 20a (between the substrate 20a and the alignment film).

The TFT substrate 10 and the counter substrate 20 produced as described above are bonded together leaving a predetermined gap therebetween. Then, the liquid crystal layer 30 is formed by injecting and sealing a liquid crystal material into the gap. In this way, the liquid crystal display device 100 is completed.

Note that the above description deals with an exemplary configuration where the common electrode 16 is located above the pixel electrode 13, but a reversed configuration where the pixel electrode 13 is located above the common electrode 16 may be adopted.

Second Embodiment

Figure 5:
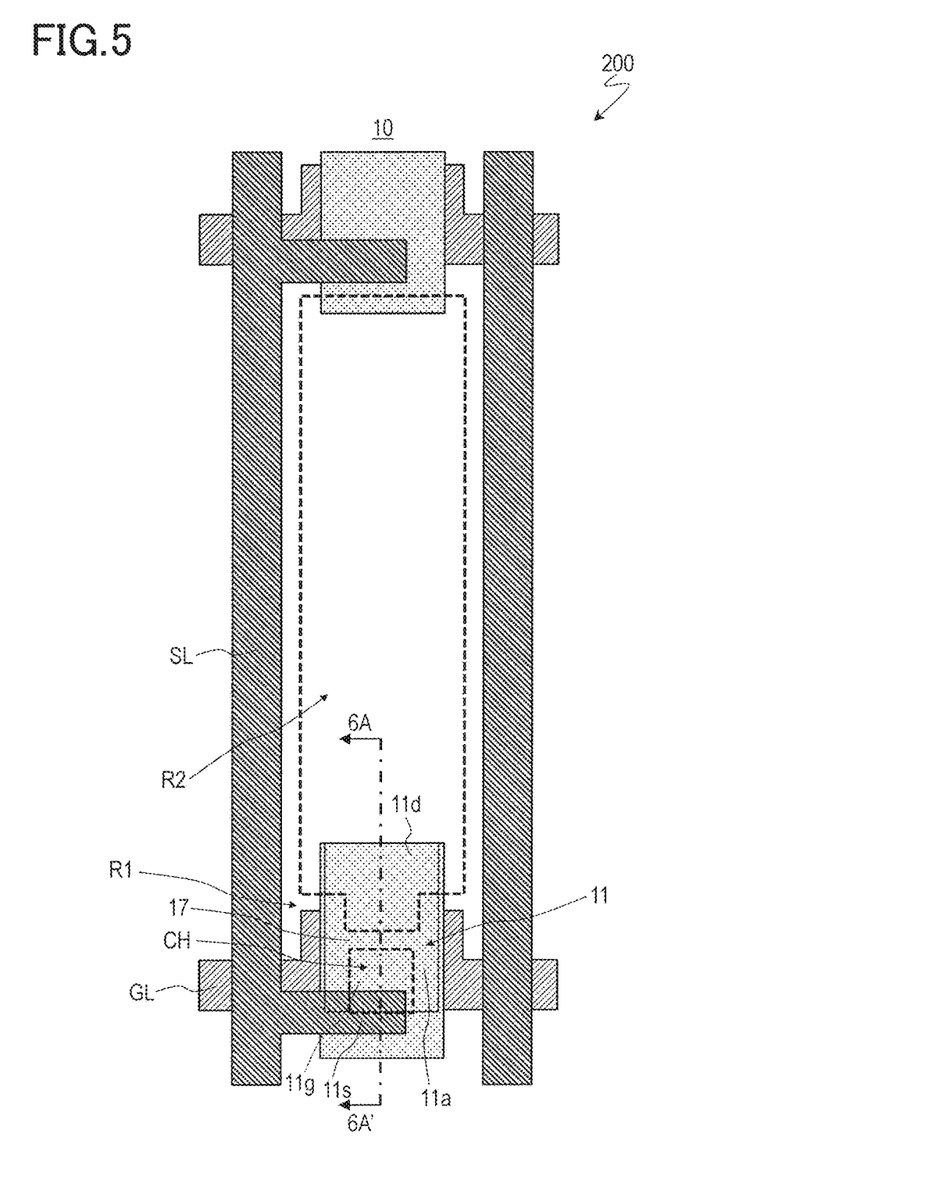
FIG. 5 is a plan view schematically illustrating another liquid crystal display device 200 according to an embodiment of the present invention and illustrates a region corresponding to one pixel.
Figure 6:
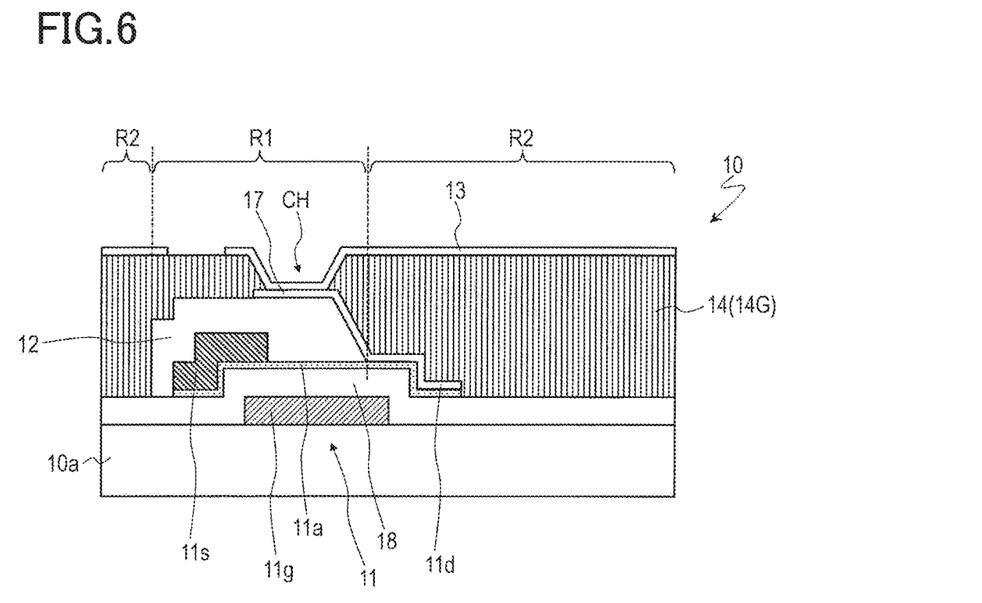
FIG. 6 is a cross-sectional view schematically illustrating the liquid crystal display device 200 and illustrates a cross-sectional structure along the line 6A-6A' in FIG. 5.

A liquid crystal display device 200 of the present embodiment will be described with reference to FIGS. 5 and 6. FIG. 5 is a plan view schematically illustrating the liquid crystal display device 200 and illustrates a region corresponding to one pixel in the liquid crystal display device 200. FIG. 6 is a cross-sectional view of the active matrix substrate 10 of the liquid crystal display device 200 and illustrates a cross-sectional structure along the line 6A-6A' in FIG. 5. The following description will primarily focus on differences between the liquid crystal display device 200 and the liquid crystal display device 100 of the first embodiment.

In the liquid crystal display device 200 of the present embodiment, the drain electrode 11d of the TFT 11 is integrally formed with the intermediate layer electrode 17 as illustrated in FIGS. 5 and 6. That is, the drain electrode 11d is a transparent drain electrode formed of a transparent conductive material, and the TFT 11 includes no drain electrode formed of a metal material. In the second region R2 of the pixel opening region, the transparent drain electrode 11d is connected to the semiconductor layer 11a.

Even in the liquid crystal display device 200 of the present embodiment, the drain electrode 11d of the TFT 11 and the pixel electrode 13 are electrically connected with the intermediate layer electrode 17 interposed therebetween, and the contact hole CH connected to the pixel electrode 13 and the intermediate layer electrode 17 at least partially overlaps the gate electrode 11g of the TFT 11. Therefore, similar to the liquid crystal display device 100 of the first embodiment, the aperture ratio and the contrast ratio can be improved.

In the present embodiment, the drain electrode 11d of the TFT 11 is a transparent drain electrode and the oxide semiconductor layer 11a can be generally transparent. Thus, a region in which the drain electrode 11d is formed can be made to contribute to the aperture ratio. Therefore, in the liquid crystal display device 200 of the present embodiment, the aperture ratio can be improved further than in the liquid crystal display device 100 of the first embodiment.

Third Embodiment

Figure 7:
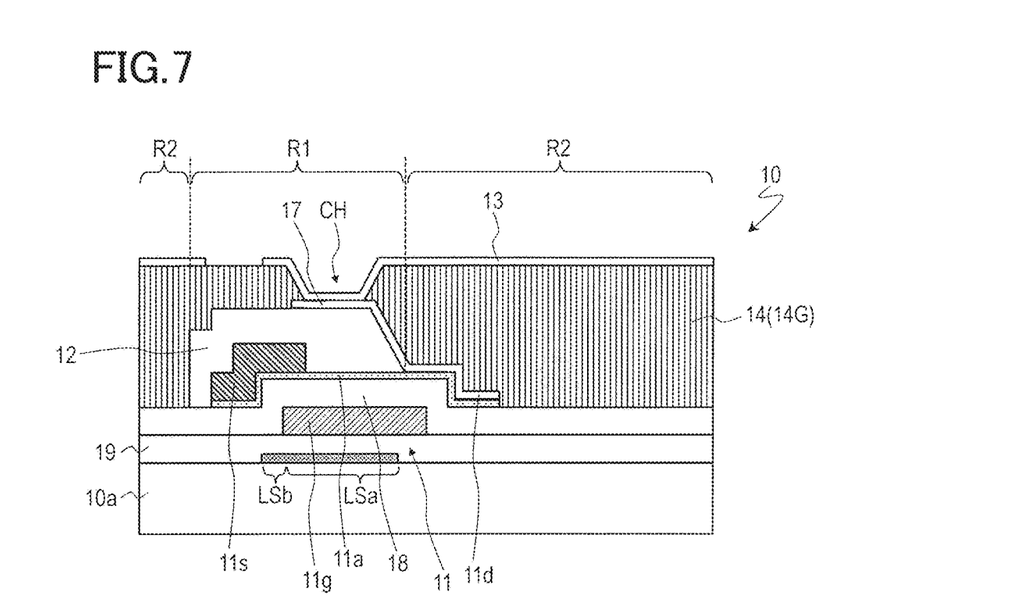
FIG. 7 is a cross-sectional view of the active matrix substrate 10 in yet another liquid crystal display device 300 according to an embodiment of the present invention.

A liquid crystal display device 300 of the present embodiment will be described with reference to FIG. 7. FIG. 7 is a cross-sectional view of the active matrix substrate 10 of the liquid crystal display device 300. The following description will primarily focus on differences between the liquid crystal display device 300 and the liquid crystal display device 200 of the second embodiment.

The liquid crystal display device 300 of the present embodiment differs from the liquid crystal display device 200 in that the TFT substrate 10 further includes a light blocking layer LS provided below the gate electrode 11g in each of the plurality of pixels. pixels.

The light blocking layer LS is provided on the substrate 10a. A lower insulating layer 19 is formed covering the light blocking layer LS. The gate electrode 11g of the TFT 11 is provided on the lower insulating layer 19. When viewed in the normal direction of a display surface, the light blocking layer LS includes a portion LSa overlapping the gate electrode 11g and a portion LSb that does not overlap the gate electrode 11g. The light blocking layer LS is formed of, for example, a metal material.

In the present embodiment, providing the light blocking layer LS makes it possible to suppress light leakage occurring near the contact hole CH and further improve the contrast ratio. From the perspective of suppressing light leakage, the light blocking layer LS preferably includes the portion LSb that does not overlap the gate electrode 11g when viewed in the normal direction of a display surface, as illustrated in the present embodiment.

Note that, even when the light blocking layer LS is provided as in the present embodiment, reduction in the aperture ratio due to the light blocking layer LS is smaller than when the liquid crystal display device 900 according to the comparative example is provided with a light blocking layer. This is because the contact hole CH at least partially overlaps the gate electrode 11g of the TFT 11 and thus the gate electrode 11g may also function as a light blocking layer.

A liquid crystal display device has been described as an example of a display device according to embodiments of the present invention. However, the display device according to embodiments of the present invention is not limited to a liquid crystal display device. The embodiments of the present invention can be suitably used in, for example, a bottom-emitting organic EL display device (type that extracts light from the back face side of a TFT substrate).

Oxide Semiconductor

The oxide semiconductor contained in the oxide semiconductor layer 11a may be an amorphous oxide semiconductor or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 11a may have a layered structure including two or more layers. When the oxide semiconductor layer 11a has a layered structure, the oxide semiconductor layer 11a may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. When the oxide semiconductor layer 11a has a dual-layer structure including an upper layer and a lower layer, an energy gap of the oxide semiconductor contained in a layer closer to a gate electrode (the upper layer in the case of a bottom gate structure) is preferably less than an energy gap of the oxide semiconductor in a layer farther from the gate electrode (the lower layer in the case of a bottom gate structure). However, in a case where the difference between the energy gaps of these layers is relatively small, the energy gap of the oxide semiconductor in the layer farther from the gate electrode may be less than the energy gap of the oxide semiconductor in the layer closer to the gate electrode.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A.

The entire contents of the disclosure of JP 2014-007399 A are incorporated herein as reference.

The oxide semiconductor layer 11a may include, for example, at least one metal element selected from In, Ga, and Zn. In embodiments of the present invention, the oxide semiconductor layer 11a includes, for example, an In—Ga—Zn—O based semiconductor (e.g., an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer 11a can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100th as compared to the a-Si TFT), and thus such a TFT can be used suitably as a driving TFT (for example, a TFT present in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 11a may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer 11a may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

According to an embodiment of the present invention, an aperture ratio of a display device provided with an active matrix substrate including a color filter can be improved. Embodiments of the present invention can be widely used in display devices provided with an active matrix substrate including a color filter, and may be particularly suitably used in high-definition liquid crystal display devices (e.g., liquid crystal display devices for HMD) and organic EL display devices.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
an active matrix substrate including
a plurality of pixels arrayed in a matrix shape having a plurality of rows and a plurality of columns, and
a plurality of scanning wiring lines extending in a row direction and a plurality of signal wiring lines extending in a column direction,
wherein the active matrix substrate includes, in each of the plurality of pixels,
a TFT including a semiconductor layer, a gate insulating layer, a gate electrode, a source electrode, and a drain electrode,
an insulating layer substantially covering the TFT,
a pixel electrode formed of a transparent conductive material and electrically connected to the TFT,
a color filter located between the TFT and the pixel electrode, and
an intermediate layer electrode formed of a transparent conductive material, at least partially located between the insulating layer and the color filter, and electrically connecting the drain electrode of the TFT to the pixel electrode,
the pixel electrode is connected to the intermediate layer electrode at a contact hole formed in the color filter, and
when viewed in a normal direction of a display surface, the contact hole at least partially overlaps the gate electrode of the TFT, wherein
in a case where a region surrounded by two adjacent scanning wiring lines of the plurality of scanning wiring lines and two adjacent signal wiring lines of the plurality of signal wiring lines is referred to as a pixel opening region, the pixel opening region includes a first region in which the insulating layer is formed and a second region in which the insulating layer is not formed and
the insulating layer is not formed except on or near the plurality of scanning wiring lines, the plurality of signal wiring lines, and the TFT.

2. The display device according to claim 1, wherein, when viewed in a normal direction of a display surface, the second region occupies not less than 30% of the pixel opening region.

3. The display device according to claim 1, wherein the drain electrode of the TFT is formed of a metal material, and
in the second region of the pixel opening region, the drain electrode of the TFT is connected to the intermediate layer electrode.

4. The display device according to claim 1, wherein the drain electrode of the TFT is a transparent drain electrode integrally formed with the intermediate layer electrode, and
in the second region of the pixel opening region, the transparent drain electrode is connected to the semiconductor layer.

5. The display device according to claim 1, wherein the active matrix substrate further includes, in each of the plurality of pixels, a light blocking layer provided below the gate electrode.

6. The display device according to claim 5,
wherein, when viewed in a normal direction of a display surface, the light blocking layer includes a portion overlapping the gate electrode and a portion not overlapping the gate electrode.

7. The display device according to claim 1,
wherein the semiconductor layer of the TFT is an oxide semiconductor layer.

8. The display device according to claim 7,
wherein the oxide semiconductor layer includes an In—Ga—Zn—O based semiconductor.

9. The display device according to claim 8,
wherein the In—Ga—Zn—O based semiconductor includes a crystalline portion.

10. The display device according to claim 1,
wherein the display device is a liquid crystal display device further including:

a counter substrate facing the active matrix substrate; and a liquid crystal layer provided between the active matrix substrate and the counter substrate.

* * * * *